(12) United States Patent
Niemann

(10) Patent No.: US 11,181,124 B2
(45) Date of Patent: Nov. 23, 2021

(54) COMPACT COOLING DEVICE WITH RADIAL FAN ADHESIVELY BONDED TO A HEAT SINK

(71) Applicant: ELEKTROSIL GMBH, Hamburg (DE)

(72) Inventor: Hendrik Niemann, Rosengarten (DE)

(73) Assignee: ELEKTROSIL GMBH, Hamburg (DE)

( * ) Notice: Subject to any disclaimer, the term of this patent is extended or adjusted under 35 U.S.C. 154(b) by 0 days.

(21) Appl. No.: 15/763,510

(22) PCT Filed: Sep. 30, 2016

(86) PCT No.: PCT/EP2016/073483
§ 371 (c)(1),
(2) Date: Mar. 27, 2018

(87) PCT Pub. No.: WO2017/055589
PCT Pub. Date: Apr. 6, 2017

(65) Prior Publication Data
US 2018/0298921 A1    Oct. 18, 2018

(30) Foreign Application Priority Data

Sep. 30, 2015 (DE) .......................... 202015105163.8

(51) Int. Cl.
*F04D 29/62* (2006.01)
*F04D 29/42* (2006.01)
(Continued)

(52) U.S. Cl.
CPC ....... *F04D 29/626* (2013.01); *F04D 25/0613* (2013.01); *F04D 25/0646* (2013.01);
(Continued)

(58) Field of Classification Search
CPC ........... H05K 7/20172; H05K 7/20909; H05K 7/20918; H05K 7/20163; F04D 29/626;
(Continued)

(56) References Cited

U.S. PATENT DOCUMENTS 5,661,638 A * 8/1997 Mira ...................... H01L 23/467
165/126
5,676,523 A * 10/1997 Lee ...................... F04D 25/0653
415/206

(Continued)

FOREIGN PATENT DOCUMENTS

EP    2299122 A2    3/2011

OTHER PUBLICATIONS

International Search Report dated Jan. 18, 2017 in corresponding Application Serial No. PCT/EP2016/073483.
(Continued)

*Primary Examiner* — Len Tran
*Assistant Examiner* — Gustavo A Hincapie Serna
(74) *Attorney, Agent, or Firm* — Grogan, Tuccillo & Vanderleeden LLP

(57) ABSTRACT

In order to give an especially compact, cost-effective and electromagnetically compatible design to a cooling device with a heat sink and a radial fan arranged in or on the receiving area of the heat sink, the bushing is adhesively bonded onto the heat sink in or on the receiving area, or the bushing is integrally designed with the heat sink.

19 Claims, 7 Drawing Sheets

(51) Int. Cl.
  *H05K 7/20* (2006.01)
  *F04D 29/58* (2006.01)
  *F04D 25/06* (2006.01)
  *H01L 23/467* (2006.01)
  *F04D 29/054* (2006.01)
  *F04D 25/08* (2006.01)
  *F28F 3/04* (2006.01)
  *H01L 23/367* (2006.01)
  *F04D 29/02* (2006.01)
  *F04D 29/056* (2006.01)

(52) U.S. Cl.
  CPC ........... *F04D 25/08* (2013.01); *F04D 29/054* (2013.01); *F04D 29/4226* (2013.01); *F04D 29/582* (2013.01); *F28F 3/04* (2013.01); *H01L 23/467* (2013.01); *H05K 7/20154* (2013.01); *H05K 7/20163* (2013.01); *H05K 7/20172* (2013.01); *F04D 29/023* (2013.01); *F04D 29/056* (2013.01); *F28F 2250/08* (2013.01); *H01L 23/3672* (2013.01)

(58) Field of Classification Search
  CPC .... F04D 29/646; F04D 25/0646; F04D 25/08; F04D 29/054; F04D 29/056; H01L 23/3672; H01L 23/467
  USPC ................. 165/80.3, 121, 122; 417/423.14
  See application file for complete search history.

(56) References Cited

U.S. PATENT DOCUMENTS

| | | | | |
|---|---|---|---|---|
| 5,830,308 A * | 11/1998 | Reichard | ............ | B29C 65/7855 156/291 |
| 5,940,269 A * | 8/1999 | Ko | ............ | H01L 23/467 361/697 |
| 5,978,219 A * | 11/1999 | Lin | ............ | G06F 1/20 165/80.3 |
| 6,170,563 B1 * | 1/2001 | Hsieh | ............ | F28F 3/04 165/122 |
| 6,348,748 B1 | 2/2002 | Yamamoto | | |
| 6,421,239 B1 * | 7/2002 | Huang | ............ | H01L 23/467 165/104.33 |
| 6,512,673 B1 * | 1/2003 | Wiley | ............ | G06F 1/183 165/185 |
| 6,650,541 B1 * | 11/2003 | Simon | ............ | H01L 23/4006 165/121 |
| 6,671,177 B1 * | 12/2003 | Han | ............ | H01L 23/467 165/80.3 |
| 6,847,524 B2 * | 1/2005 | Tomioka | ............ | G06F 1/203 165/121 |
| 7,063,510 B2 * | 6/2006 | Takeshita | ............ | F04D 29/281 257/E23.099 |
| 7,486,519 B2 * | 2/2009 | Loiler | ............ | G06F 1/20 165/121 |
| 7,684,190 B2 * | 3/2010 | Aoki | ............ | G06F 1/20 361/695 |
| 7,787,247 B2 * | 8/2010 | Han | ............ | G06F 1/20 361/679.47 |
| 8,057,168 B2 * | 11/2011 | Hsu | ............ | F04D 29/4226 415/204 |
| 8,313,284 B2 * | 11/2012 | Hirata | ............ | F04D 29/4226 415/119 |
| 8,974,196 B2 * | 3/2015 | Chen | ............ | F04D 29/056 417/354 |
| 9,033,028 B2 * | 5/2015 | Wang | ............ | F28D 15/0266 165/104.33 |
| 2003/0007872 A1 | 1/2003 | Bradbury et al. | | |
| 2003/0043546 A1 * | 3/2003 | Novotny | ............ | F25D 19/00 361/699 |
| 2007/0097643 A1 * | 5/2007 | Cheng | ............ | H01L 23/427 361/700 |
| 2007/0133179 A1 * | 6/2007 | Han | ............ | H01L 23/427 361/719 |
| 2008/0035315 A1 * | 2/2008 | Han | ............ | F04D 17/04 165/121 |
| 2008/0174956 A1 | 7/2008 | Alex | | |
| 2008/0314576 A1 * | 12/2008 | Meng | ............ | H05K 7/20154 165/185 |
| 2009/0047148 A1 * | 2/2009 | Chen | ............ | F04D 29/056 417/354 |
| 2011/0194930 A1 | 8/2011 | Ai et al. | | |
| 2012/0243093 A1 * | 9/2012 | Tonar | ............ | H01L 41/0973 359/507 |
| 2014/0093405 A1 | 4/2014 | Chang et al. | | |
| 2015/0098844 A1 * | 4/2015 | Hsu | ............ | F04D 25/062 417/354 |

OTHER PUBLICATIONS

European Examination Report dated Aug. 20, 2019 in corresponding Application Serial No. 1678408 4.
Chinese Office Action dated May 24, 2019 in corresponding Chinese Application Serial No. 201680057345.8.

* cited by examiner

COMPACT COOLING DEVICE WITH RADIAL FAN ADHESIVELY BONDED TO A HEAT SINK

TECHNICAL AREA

The invention relates to a cooling device with a heat sink and a fan arranged in a receiving area of the heat sink, wherein the fan is designed as a radial fan and mounted in a bushing by means of a fan bearing.

Heat sinks are usually used for cooling electrical components and dissipating or radiating heat from electrical components. In order to be able to remove heat, the heat sink has a material with a good thermal conductivity. In addition, heat sinks can have varying shapes and geometries so as to be better able to dissipate or radiate the heat. For example, cooling ribs can be provided on the heat sink, so as to increase the effective surface of the heat sink.

So-called active cooling units are used to more effectively dissipate heat as well as to not just dissipate heat from electrical components, but also to simultaneously ensure sufficient cooling. For example, a fan is suitably connected with a heat sink to this end. Known in prior art for this purpose are axial fans along with radial fans. Such fans usually have a fan propeller made out of plastic, with blades for conveying air. The fan propeller is arranged in a plastic housing. Various fan bearings can be provided for mounting the fan propeller in the plastic housing. The fan housing usually has fastening elements, for example screw connections, for fastening the fan to the heat sink.

PRIOR ART

For example, DE 295 05 830 U1 describes an arrangement for cooling electrical components. The arrangement consists of a heat sink with a base plate and cooling ribs situated thereon, as well as of a fan situated on the heat sink for generating an air flow.

DESCRIPTION OF THE INVENTION: OBJECT, SOLUTION, ADVANTAGES

The object of the present invention is to give an especially compact, cost-effective and electromagnetically compatible design to a cooling device with a heat sink and a radial fan connected with the heat sink.

This object is achieved by a cooling device having a heat sink and a fan situated in or on a receiving area of the heat sink. The fan is designed as a radial fan, and mounted in a bushing by means of a fan bearing. The fan is thus connected with the heat sink in or on the receiving area of the heat sink. According to the invention, the bushing is adhesively bonded onto the heat sink in or on the receiving area.

The heat sink is used to dissipate the heat emitted by electrical and/or electronic components. To this end, the heat sink consists of a heat conducting material. For example, the heat sink can be made out of an aluminum-containing alloy and/or fabricated as a die cast part. The receiving area on the heat sink is to be understood as any area suitable for arranging the fan. For example, the receiving area can be situated on or in the heat sink. The receiving area for arranging the fan can be provided on top of or on a lateral surface of the heat sink. In addition, the receiving area can extend into the heat sink or into a base body of the heat sink.

To be understood as a fan within the meaning of the present invention is a rotating mechanical fan, for example a ventilator. The fan generates a volume flow for dissipating hot air. According to the invention, the fan is designed as a radial fan for this purpose. This facilitates an especially flat or very compact structural shape for the active cooling device. The fan has a rotatable fan propeller with fan blades. The fan or fan propeller is mounted in a bushing by means of a fan bearing.

In prior art, such fans have a plastic housing, in which the fan propeller is arranged. The fan propeller is here regionally enveloped by the plastic housing. The plastic housing has fastening means for fastening, for example screwing, the fan to the heat sink.

In the active cooling device according to the invention, the bushing in which the fan or fan propeller is mounted is adhesively bonded directly or indirectly onto the heat sink.

As opposed to prior art, the fan preferably has no additional housing, for example plastic housing. The fan especially preferably has no housing part that regionally envelops the fan blades. As a consequence, the housing of the radial fan especially preferably consists of the cooling device itself or at least regionally of heat sinks.

The bushing serves to accommodate the fan bearing. To this end, the bushing is designed as a hollow body, for example in the form of a pipe or pipe section. The bushing can be open on one or both sides. The bushing can further have any suitable cross section, in particular a round cross section. A bushing adhesively bonded directly or indirectly onto the heat sink means either that the bushing is adhesively bonded directly onto the heat sink, for example in the area of a frontal end of the bushing, or adhesively bonded onto the heat sink via an additional spacer.

Alternatively, the bushing is integrally designed with the heat sink, and thus integrated into the heat sink. To this end, the heat sink can have a protruding hollow body in or on the receiving area, for example in the form of a pipe or pipe section, which forms the bushing. The heat sink preferably has a heat sink through passage in the receiving area, for example a hole through a floor plate of the heat sink, which can be completely enveloped by the bushing.

In particular, the active cooling device according to the invention makes it possible to provide a very compact, in particular very flat, cooling device without unnecessary through passages, for example holes, for fastening the fan. This ensures the required EMC shielding of the active cooling device. As a consequence, the cooling device can be used for a wireless charging station, e.g., for a mobile phone, smartphone or a tablet computer.

The bushing being adhesively bonded directly or indirectly onto the heat sink further eliminates the need for a housing for the fan. This facilitates air conveyance or the air flow, and enables an even more compact configuration of the active cooling device.

The front end of the bushing preferably has a plate. This plate forms a contact surface for placing the bushing on the heat sink. Arranged between the plate and heat sink is an adhesive layer, which adhesively bonds the bushing onto the heat sink. As a consequence, the frontally arranged plate forms the contact surface for the fan on the heat sink on the one hand, and enlarges the adhesive surface on the other. For example, the adhesive layer can be applied to the plate in the form of an adhesive film. After removing a protective film, the fan can be placed or adhesively bonded onto the heat sink. The plate is preferably designed in such a way that this yields an essentially planar contact surface or adhesive surface.

In addition, it is preferably provided that the plate be annular in design, and have both an internal and an external diameter. The external diameter is here larger than a diameter of a bushing opening for accommodating the fan bearing. The annular plate is preferably continuous and radially protruding in the area of a front end of the bushing, i.e., arranged essentially perpendicular to the shell surface of the bushing. The annular plate is especially preferably arranged around the entire periphery of the shell surface of the bushing.

It is also preferably provided that the internal diameter of the annularly designed plate essentially corresponds to the diameter of the bushing opening for accommodating the fan bearing. As a consequence, the adhesive surface formed by the plate is arranged not directly underneath the bushing opening, but around the opening. The external diameter of the annularly designed plate is preferably smaller than a propeller fan diameter of the fan. Adhesively bonding the bushing onto the heat sink eliminates the need for a larger plate. Therefore, the plate need not protrude peripherally or in a radial direction over the propeller fan or over the fan blades, since the fan is not screwed onto the heat sink.

The plate preferably has a through passage, especially preferably several through passages. The through passage can be designed as a hole through the plate. Several through passages are preferably spaced apart one from the other. The through passage can have any suitable shape, for example a round or angular shape. The through passage through the plate or through passages through the plate make it easier to position and fix the bushing in the receiving area on the heat sink. For example, projections that correspond with the through passages through the plate can be provided in the receiving area, upon which the bushing or plate can be placed. This prevents the bushing from rotating after placement in an especially advantageous manner.

The thickness of the plate is preferably smaller than half the length of the bushing. The thickness of the plate is especially preferably smaller than ¼ of the length of the bushing. The thickness of the plate is very especially preferably smaller than ⅛ of the length of the bushing. Since the bushing is adhesively bonded and not screwed onto the heat sink in the area of the plate, the thickness of the plate can be especially thin in design. This also yields an especially compact, in particular flat, design for the active cooling device.

The bushing preferably has plastic or preferably consists of plastic. The bushing is especially preferably integrally designed with the plate. The plate also has plastic or also consists of plastic.

The adhesive layer preferably has a thickness of between 0.5 mm and 2 mm, especially preferably of between 0.6 mm and 1.5 mm, and very especially preferably of between 0.8 mm and 1.2 mm. An adhesive layer with a thickness in this aforementioned range has sufficient elasticity, and can further absorb vibration.

In addition, it is preferably provided that the adhesive layer have a reaction adhesive or consist thereof. The reaction adhesive can be one-component or multicomponent in design. It is also preferably provided that the adhesive layer have a sponge rubber or consist thereof. In an especially advantageous manner, the adhesive layer is designed as a sponge rubber adhesive tape.

The heat sink preferably has several cooling ribs that border the receiving area. The cooling ribs are preferably longitudinally oriented, meaning situated along the length of the heat sink. The cooling ribs are further preferably spaced apart relative to each other and essentially arranged over the entire width of the heat sink. Individual cooling ribs especially preferably have varying lengths.

In addition, it is preferably provided that the receiving area be at least partially enveloped by a wall regionally arranged around the receiving area. The wall is part of the heat sink, and bent or regionally circular in design. The special shape of the wall guides and diverts the air flow in an especially suitable manner. The wall is at least regionally arranged between the cooling ribs and the receiving area. The cooling ribs are especially preferably arranged essentially parallel to each other, and at least one cooling rib is directed perpendicularly away from the wall, wherein at least one additional cooling rib is arranged essentially tangentially to the wall. The wall envelops the receiving area in which the fan is arranged, advantageously at least regionally over the entire width of the heat sink. The wall further separates the receiving area preferably from the area in which the cooling ribs are arranged, such that the air flow generated by the fan is not directly relayed between individual cooling ribs, but rather guided to the cooling ribs along the wall.

The wall also has an arcuate progression, which guides the air flow and accelerates it in an especially advantageous manner.

The wall further preferably at least regionally has a spiral geometry. What this means is that the progression of the wall follows a curve, which is essentially shaped like a spiral coil. The wall here runs along a curve at least regionally around the bushing, wherein the distance between the bushing and wall changes depending on the perspective of an observer on individual points along the wall.

The distance between the bushing and wall advantageously varies in size at several locations along the wall. The distance between the bushing and wall especially preferably varies in size at a plurality of locations along the wall.

It is also preferably provided that the distance between the bushing and wall along the wall continuously increase at least in one area in the rotational direction of the fan.

The area over which the distance between the bushing and wall continuously increases in the rotational direction of the fan advantageously extends along a circular segment over an angle of more than 180°. As a consequence, it is advantageously provided that the distance between the bushing and wall in the rotational direction of the fan continuously increase along an arc length over more than half of a circular arc.

Advantageously arranged in the receiving area is a recess, wherein the plate of the bushing is situated in the recess. To this end, the recess especially preferably has a round diameter, which essentially corresponds to the external diameter of the plate or is only slightly larger. As a result of the recess in the receiving area, it is especially easy to position the bushing to be adhesively bonded to the heat sink. In addition, this ensures an even flatter construction for the active cooling device.

Advantageously arranged in the recess is at least one projection, especially preferably several projections. The projection or projections can have whatever or any suitable shape desired. The projection or projections is/are especially preferably arranged and designed to correspond with a through passage or several through passages through the plate. While placing the bushing into the recess, the at least one projection protrudes into or through the through passage in the plate of the bushing.

It is preferred that no through passage be arranged through the heat sink in the receiving area, in particular in an area covered by the fan on the heat sink.

In addition, the receiving area and fan are at least regionally covered by a single cover. The fan is then arranged between the heat sink and cover. As a consequence, the heat sink together with the cover form a housing for the fan. The space in which the air flow is conveyed is thus enclosed on one side by the heat sink, and from the other side by the cover. This space is a least regionally continuously enclosed by the wall. The cover especially preferably has plastic or consists of plastic. The cover serves both to protect the fan and to guide the airflow in the desired direction.

The bushing is preferably designed in such a way that the fan can be clipped and/or pressed into the bushing. To this end, wedge-shaped projections that protrude radially or outwardly can be provided inside of the bushing. The fan can thus be positively connected with the bushing.

BRIEF DESCRIPTION OF THE DRAWINGS

The invention will now be exemplarily explained in relation to the accompanying drawings based upon especially preferred embodiments.

Schematically shown on.

PREFERRED EMBODIMENTS OF THE INVENTION

Figure 1:
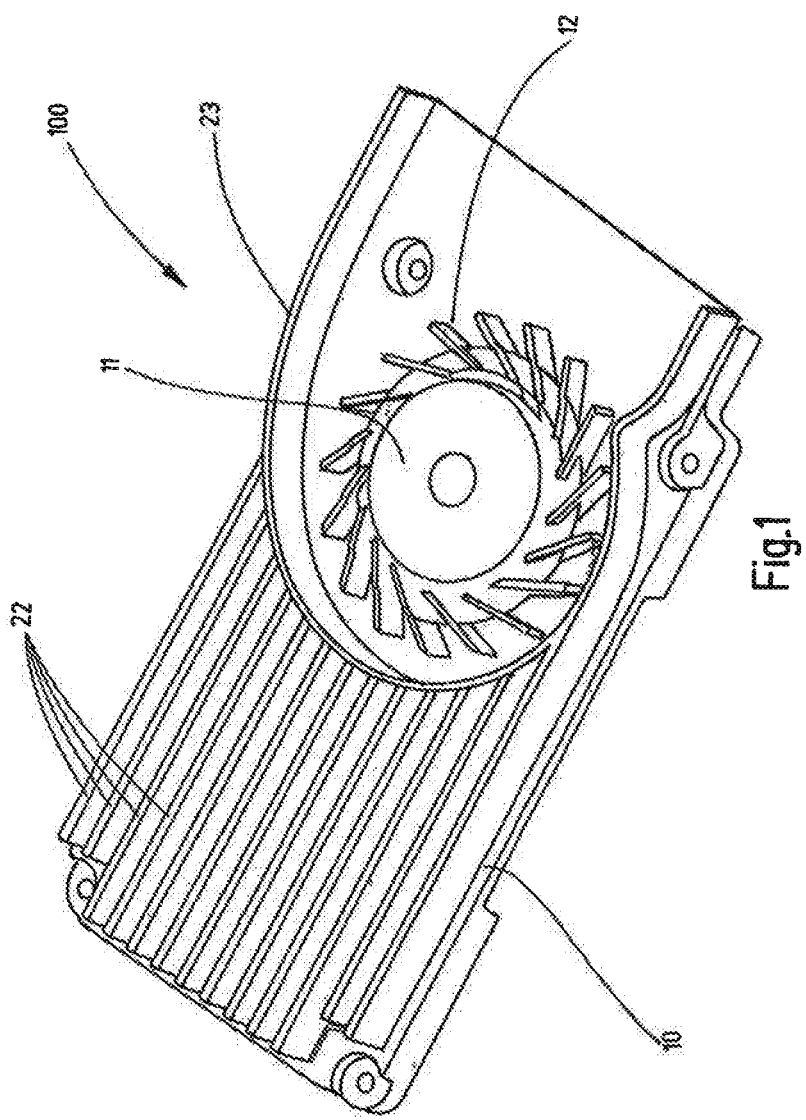
FIG. 1: is a perspective view of an active cooling device.

FIG. 1 shows a perspective view of an active cooling device 100 with a fan 11 adhesively bonded onto a heat sink 10 in a receiving area 12. The fan 11 is here mounted without any separate fan housing in a bushing 13 (not depicted on FIG. 1) and adhesively bonded onto the heat sink 10 via this bushing 13.

The receiving area 12 is arranged in one half of the heat sink 10, and extends regionally over the entire width of the heat sink 10. Longitudinally directed cooling ribs 22 arranged parallel to each other are located in the area of the other half of the heat sink 10. The cooling ribs 22 border the receiving area 12 or wall 23 designed like an arc that runs around the receiving area 12. The wall 23 is essentially shaped like a spiral coil, so that the wall 23 or the receiving area 12 has a spiral geometry.

Figure 2:
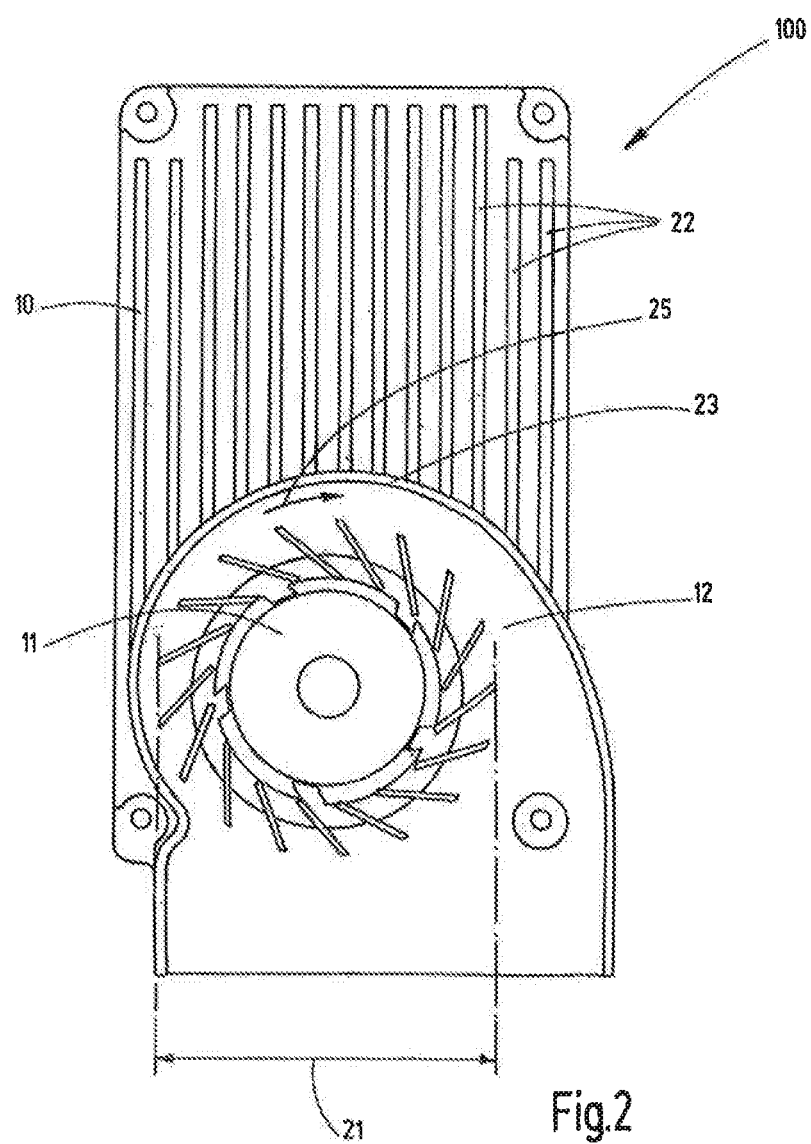
FIG. 2: is a top view of an active cooling device.

FIG. 2 presents a top view of the active cooling device 100 from FIG. 1. Recorded on FIG. 2 is the diameter 21 of the propeller wheel along with the rotational direction 25 of the propeller wheel. As evident from FIG. 2, the spiral geometry of the receiving area 12 or the wall 23 running around the receiving area 12 causes the distance between the fan 11 and wall 23 to increase along the wall 23 in the rotational direction 25 of the fan. In addition, the bushing 13 or plate 15 of the bushing 13 is covered by the fan 11 as viewed from above on the active cooling device 100, and thus not visible on FIG. 2, since the plate 15 has a smaller external diameter 18 than the propeller wheel.

Figure 3:
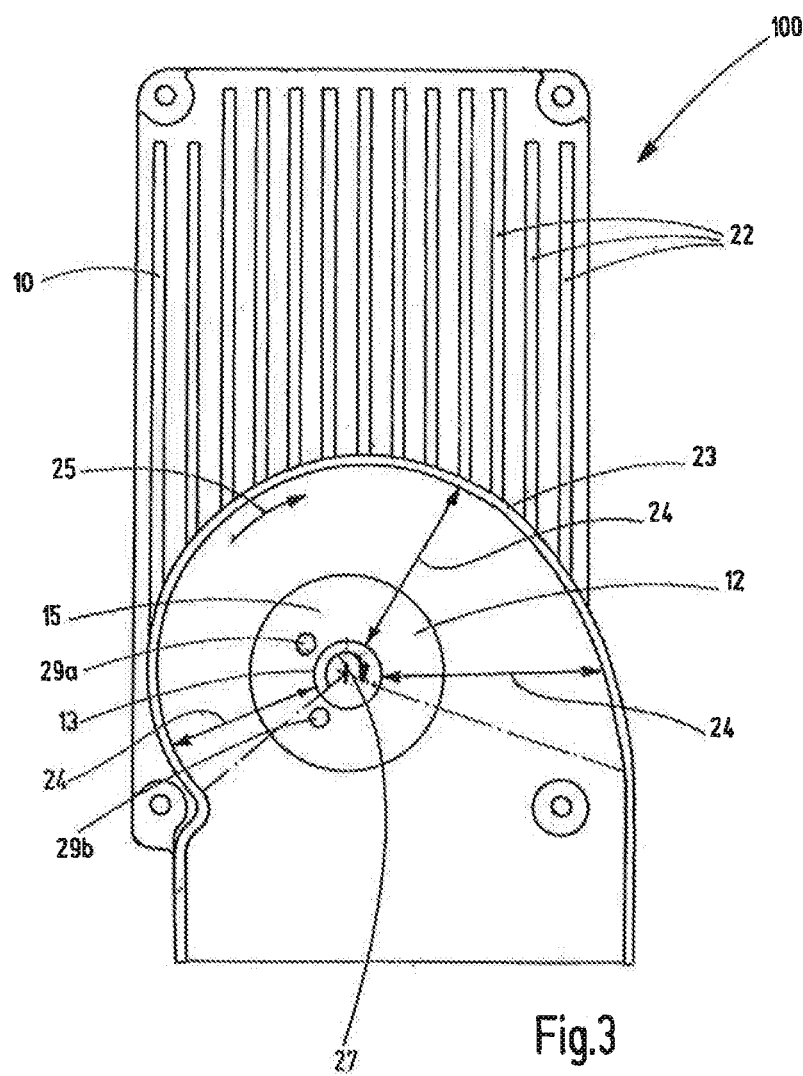
FIG. 3: is a top view of a cooling device with fan removed.

FIG. 3 presents a top view of the cooling device 100, wherein the fan 11 was removed to provide a better overview. As a consequence, the bushing 13 arranged in the receiving area 12 is visible on FIG. 3, and adhesively bonded onto the heat sink 10. To this end, an adhesive layer 90 (depicted on FIG. 6B) is arranged on the bottom side of the plate 15 of the bushing 13, and thus between the plate 15 and heat sink 10. The plate 15 is annular in design, spaced radially apart from the outer wall of the bushing 13, and forms a planar contact surface for placing the bushing 13 onto the heat sink 10. The plate 15 has two through passages 32, through which projections 29a, 29b of the heat sink 10 protrude.

The distance between the wall 23 and bushing 13 increases in the rotational direction 25 of the fan 11 (not depicted on FIG. 3) at least along an area that includes a circular segment over an angle 27.

Figure 4A:
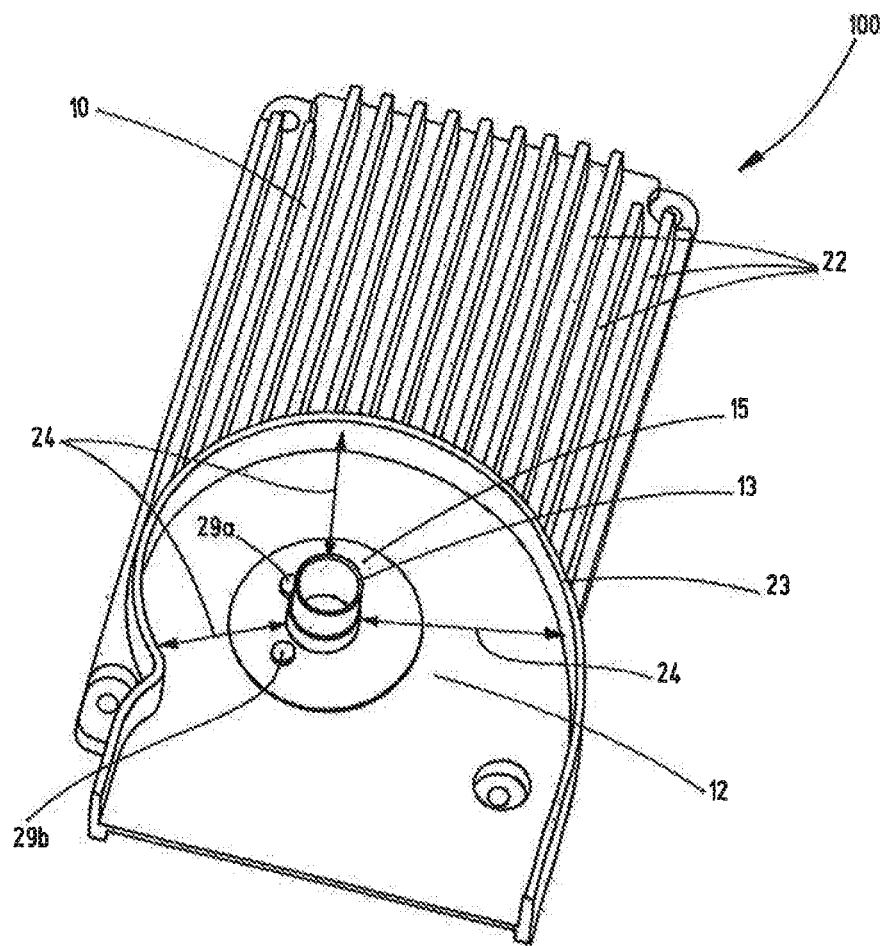
FIG. 4a: is a perspective view of a cooling device with adhesively bonded bushing and with fan removed.

FIG. 4a presents a perspective view of the cooling device 100 from FIG. 3, and thus with the fan 11 removed.

Figure 4B:
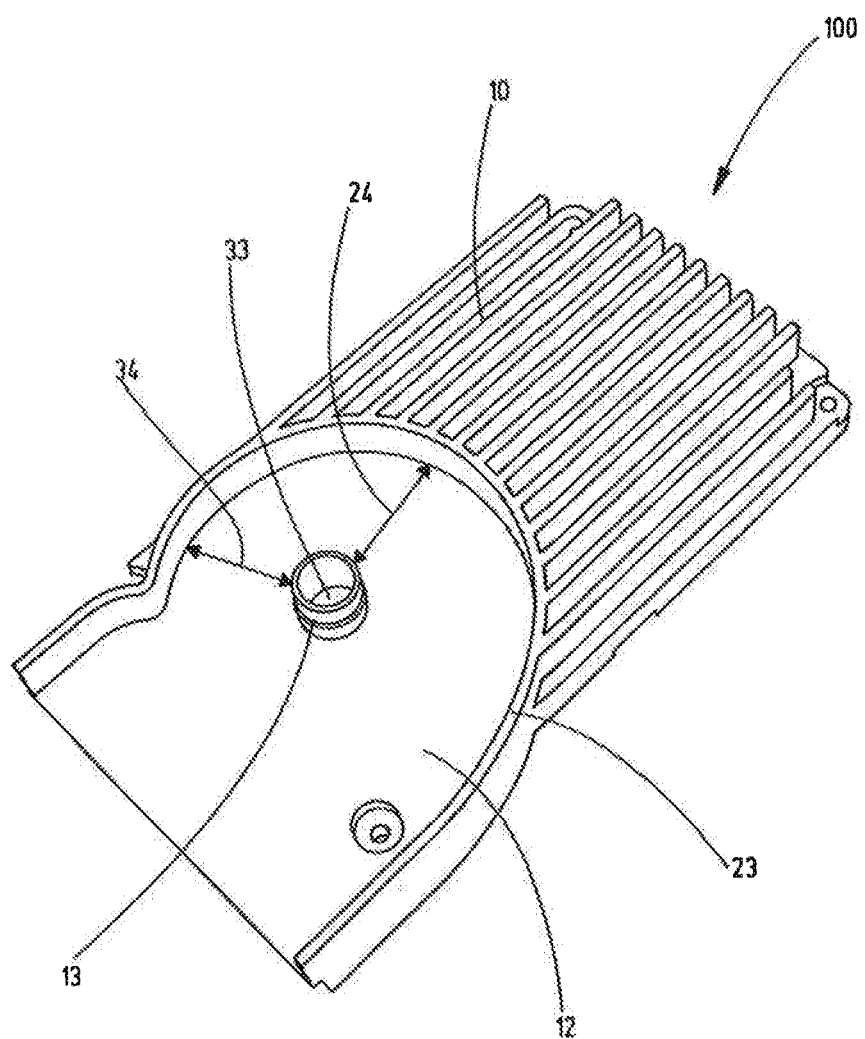
FIG. 4b: is a perspective view of a cooling device with integrated bushing and with fan removed.

FIG. 4b shows an embodiment of a cooling device 100, wherein the bushing 13 is integrally designed with the heat sink 10, and thus integrated into the heat sink 10. To this end, the heat sink 10 has a protruding hollow body in or on the receiving area 12 in the form of a pipe or pipe section, which comprises the bushing 13. Arranged in the receiving area 12 is a heat sink through passage 33 in the form of a hole through a floor plate of the heat sink 10, which is completely enveloped by the bushing 13. The fan 11 can be clipped and/or pressed into this integrated bushing.

Figure 5:
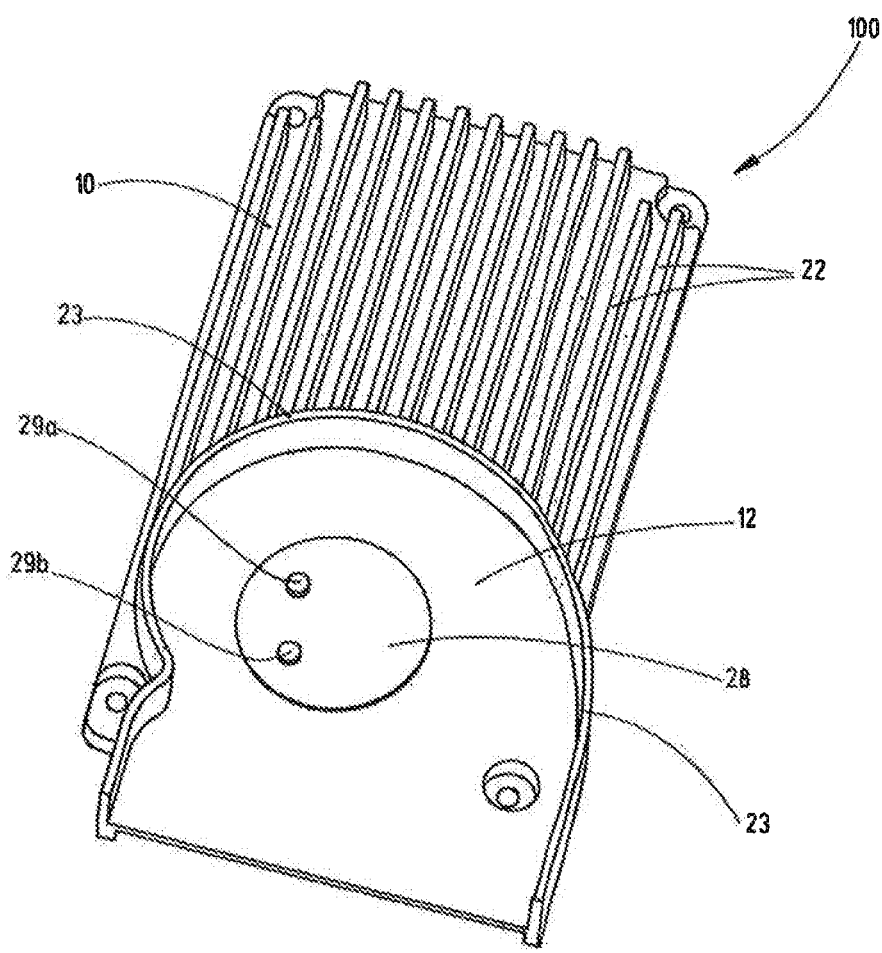
FIG. 5: is a perspective view of a heat sink for an active cooling device.

FIG. 5 shows the heat sink 10 of an active cooling device 100. Arranged inside of the recess 28 are two projections 29a, 29b for fixing and positioning the bushing 13 (not depicted on FIG. 5). The bushing 13 with its plate 15 is arranged in the recess 28 and adhesively bonded onto the heat sink 10.

Figure 6A:
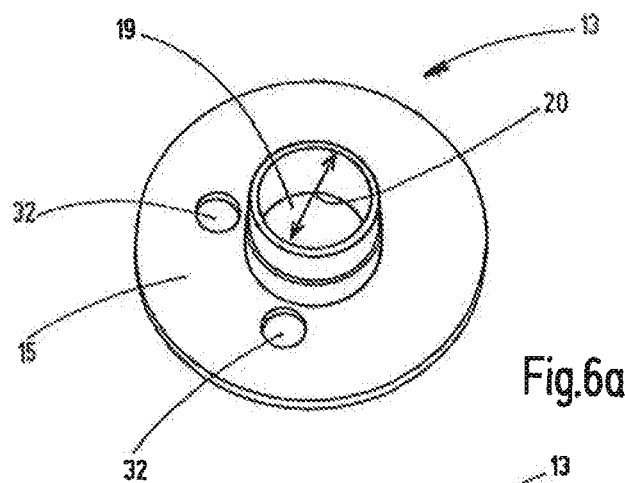
FIG. 6a to FIG. 6c: are views of a bushing for mounting a fan and for connecting the fan on the heat sink.
Figure 6B:
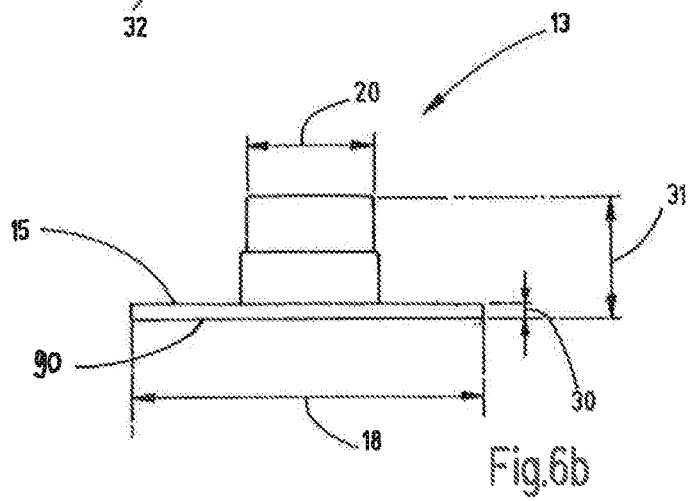
Figure 6C:
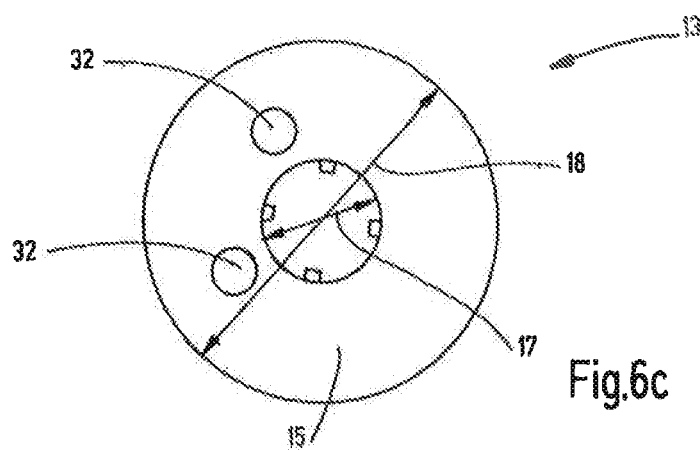

FIGS. 6a to 6c show the bushing 13 with the annularly designed plate 15. FIG. 6a presents a perspective view of the bushing 13. FIG. 6b presents a side view and FIG. 6c a view of the bottom side of the bushing 13. The bushing 13 has a bushing opening 19 with a diameter 20. The fan 11 (not depicted on FIGS. 6a to 6c) is mounted in the bushing opening 19. The diameter 20 of the bushing opening 19 essentially corresponds to the internal diameter 17 of the annularly designed plate 15.

The annularly designed plate 15 provides two circular through openings 32. The plate 15 has a thickness 30 which is many times smaller than the entire length 31 of the bushing 13.

REFERENCE LIST

100 Cooling device
10 Heat sink
11 Fan
12 Receiving area
13 Bushing
14 Front end of the bushing
15 Plate
16 Adhesive layer
17 Internal diameter of the annular plate
18 External diameter of the annular plate
19 Bushing opening
20 Diameter of the bushing opening
21 Propeller fan diameter
22 Cooling ribs
23 Wall
24 Distance between the bushing and wall
25 Rotational direction of the fan
26 Area
27 Angle
28 Recess 29a, 29b Projection
30 Thickness of the plate
31 Length of the plate
32 Through passage
33 Heat sink through passage

The invention claimed is:

1. A cooling device, comprising:
a heat sink,
a receiving area on one half of the heat sink, and extending over an entire width of the heat sink,
a fan arranged in or on the receiving area,
wherein the fan is designed as a radial fan,
wherein the fan is mounted in a bushing by means of a fan bearing,
wherein the bushing includes a plate having at least one through passage,
wherein the bushing is adhesively bonded onto the heat sink in or on the receiving area via an adhesive layer between the plate and the heat sink,
wherein a recess is formed in a floor plate of the heat sink in the receiving area, wherein the plate of the bushing is situated in the recess,
wherein at least one projection is arranged in the recess,
wherein no through passage through the heat sink is arranged in the receiving area in an area covered by the fan on the heat sink;
wherein the heat sink has several cooling ribs; and
wherein a wall separates the receiving area from the area in which the cooling ribs are arranged, such that the air flow generated by the fan is not directly relayed between individual cooling ribs, but rather guided to the cooling ribs along the wall,
wherein the wall is solidly continuous with no through passages provided in the area against the ribs and moving air from the fan is guided only by the wall;
wherein the receiving area beyond the wall is free from any air guiding elements and airflow in the receiving area is unaffected by airflow from the fan;
wherein the wall has a spiral geometry; and,
wherein the distance between the bushing and the wall varies in size at several locations along the wall.

2. The cooling device according to claim 1,
wherein the plate is annular in design, and has both an internal diameter and an external diameter, wherein the external diameter is larger than a diameter of a bushing opening for accommodating the fan bearing.

3. The cooling device according to claim 2,
wherein the internal diameter of the annularly designed plate essentially corresponds to the diameter of the bushing opening for accommodating the fan bearing.

4. The cooling device according to claim 2,
wherein the external diameter of the annularly designed plate is smaller than a propeller fan diameter of the fan.

5. The cooling device according to claim 1,
wherein a thickness of the plate is smaller than half the length of the bushing.

6. The cooling device according to claim 1,
wherein the bushing has plastic or consists of plastic.

7. The cooling device according to claim 1,
wherein the adhesive layer has a thickness of between 0.5 mm and 2 mm.

8. The cooling device according to claim 1,
wherein the adhesive layer has a reaction adhesive or consists thereof.

9. The cooling device according to claim 1,
wherein the Adhesive layer has a sponge rubber or consists thereof.

10. The cooling device according to claim 1,
wherein the heat sink has several cooling ribs that border the receiving area.

11. The cooling device according to claim 1,
wherein the receiving area is at least partially enveloped by a regionally continuous wall.

12. The cooling device according to claim 11,
wherein the wall has an arcuate progression, and is designed to guide and accelerate the air flow.

13. The cooling device according to claim 11,
wherein the wall at least regionally has a spiral geometry.

14. The cooling device according to claim 11,
wherein a distance between the bushing and wall varies at several locations along the wall.

15. The cooling device according to claim 11,
wherein a distance between the bushing and wall along the wall continuously increases at least in a second area in the rotational direction of the fan.

16. The cooling device according to claim 15,
wherein the second area includes a circular segment over an angle of more than 180°.

17. The cooling device according to claim 1,
wherein no through passage is arranged through the heat sink in the receiving area.

18. The cooling device according to claim 1,
wherein the receiving area and fan are at least regionally covered by a single cover.

19. A cooling device, comprising:
a heat sink having a floor plate;
a receiving area on a portion of the heat sink and extending across an entire width of the heat sink, the receiving area including a recess having at least one projection; and
a bushing having a plate, the plate having at least one through passage;
a radial fan mounted in the bushing by means of a fan bearing;
wherein the plate of the bushing is received in the recess in the floor plate of the heat sink in the receiving area such that the at least one projection is received in the at least one through passage;
wherein the plate of the bushing is adhesively bonded to the receiving area of the heat sink via an adhesive layer between the plate and the heat sink so that the fan is arranged in or on the receiving area of the heat sink;
wherein the receiving area of the heat sink is devoid of any through passage in an area covered by the fan;
wherein the heat sink has several cooling ribs; and
wherein a solid and continuous wall with no through passages provided in the area against the ribs and with at least regionally a spiral geometry separates the receiving area from the area in which the cooling ribs are arranged, such that the air flow generated by the fan is guided solely by the wall, not directly relayed between individual cooling ribs, but rather guided to the cooling ribs along the wall; and,
wherein the airflow in the receiving area is unaffected by airflow from the fan, said receiving area further lacking any air guiding elements.

* * * * *